US012585564B2

(12) United States Patent
Gutierrez et al.

(10) Patent No.: US 12,585,564 B2
(45) Date of Patent: Mar. 24, 2026

(54) METHODS FOR CONFIGURING SPAN OF CONTROL UNDER VARYING TEMPERATURE

(71) Applicant: Advanced Micro Devices, Inc., Santa Clara, CA (US)

(72) Inventors: Anthony Gutierrez, Bellevue, WA (US); Yasuko Eckert, Bellevue, WA (US); Sergey Blagodurov, Bellevue, WA (US); Jagadish B. Kotra, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 274 days.

(21) Appl. No.: 17/118,404

(22) Filed: Dec. 10, 2020

(65) Prior Publication Data

US 2022/0188208 A1 Jun. 16, 2022

(51) Int. Cl.
*G06F 11/30* (2006.01)
*G06F 1/20* (2006.01)
(Continued)

(52) U.S. Cl.
CPC .......... *G06F 11/3058* (2013.01); *G06F 1/206* (2013.01); *G06F 9/30079* (2013.01);
(Continued)

(58) Field of Classification Search
CPC .. G06F 11/3058; G06F 1/206; G06F 9/30079; G06F 9/4881; G06F 11/3037; G06F 12/0815; G06F 2212/601; G06F 12/0864; G06F 12/084; G06F 12/0844; G06F 2201/81; G06F 9/5094; G06F 11/0754;

G06F 1/3275; G06F 3/0604; G06F 3/0653; G06F 1/20; G06F 3/0634; G06F 3/0659; G06F 3/0688; G06F 11/2092;
(Continued)

(56) References Cited

U.S. PATENT DOCUMENTS

| | | | | | |
|---|---|---|---|---|---|
| 5,928,365 | A | * | 7/1999 | Yoshida | G06F 12/023 |
| | | | | | 713/340 |
| 7,234,027 | B2 | * | 6/2007 | Kohn | G06F 9/3004 |
| | | | | | 713/400 |

(Continued)

FOREIGN PATENT DOCUMENTS

| | | | | |
|---|---|---|---|---|
| EP | 0948227 A1 | 10/1999 | | |
| KR | 102414047 B1 | * | 6/2022 | ......... G06F 13/1657 |

(Continued)

OTHER PUBLICATIONS

Zhou, Minxuan, et al. "Temperature-aware dram cache management—relaxing thermal constraints in 3-d systems." IEEE Transactions on Computer-Aided Design of Integrated Circuits and Systems 39.10 (2019): 1973-1986. (Year: 2019).*

(Continued)

*Primary Examiner* — Charles Rones
(74) *Attorney, Agent, or Firm* — FIG. 1 Patents

(57) ABSTRACT

A method may include, in response to a change in an operating parameter of a processing unit, modifying a signal pathway to a processing circuit component of the processing unit, and communicating with the processing circuit component via the signal pathway.

20 Claims, 8 Drawing Sheets

(51) Int. Cl.

| | |
|---|---|
| *G06F 9/30* | (2018.01) |
| *G06F 9/48* | (2006.01) |
| *G06F 12/0815* | (2016.01) |
| *G06F 12/0864* | (2016.01) |
| *G11C 11/406* | (2006.01) |

(52) U.S. Cl.

CPC ........ G06F 9/4881 (2013.01); G06F 11/3037 (2013.01); G06F 12/0815 (2013.01); G06F 12/0864 (2013.01); G11C 11/40626 (2013.01)

(58) Field of Classification Search

CPC .... G06F 11/2094; G06F 3/0679; G06F 3/061; G06F 3/0614; G06F 3/0683; G06F 11/3062; G06F 1/3225; G06F 11/3055; G06F 13/1689; G06F 1/3206; G06F 1/324; G06F 11/1441; G06F 11/2015; G06F 12/0877; G06F 2212/1028; G06F 3/0616; G06F 1/3234; G06F 1/3296; G06F 11/3433; G06F 11/3457; G06F 12/0223; G06F 12/023; G06F 12/10; G06F 12/122; G06F 13/1668; G06F 13/18; G06F 13/24; G06F 13/4282; G06F 2212/1016; G06F 3/0629; G06F 3/0631; G06F 3/0644; G06F 3/0658; G06F 3/0673; G06F 1/263; G06F 1/28; G06F 1/305; G06F 1/3287; G06F 1/329; G06F 11/3024; G06F 11/3034; G06F 11/3409; G06F 11/348; G06F 12/0246; G06F 12/0802; G06F 12/0846; G06F 12/0895; G06F 2201/88; G06F 2201/885; G06F 2212/502; G06F 3/0619; G06F 9/5011; G06F 12/0842; G06F 12/0871; G06F 2212/1048; G06F 2212/6042; G06F 9/30138; G06F 9/5016; G06F 9/5027; G06F 9/5038; G06F 9/505; G06F 9/5066; G06F 9/5077; G11C 11/40626; G11C 7/04; G11C 2207/2245; G11C 11/221; G11C 11/2273; G11C 11/2275; G11C 11/4074; G11C 11/409; G11C 2029/0409; G11C 2029/0407; G11C 29/20; G11C 29/46; G11C 29/52; G11C 29/76; G11C 5/04; G11C 11/2259; G11C 11/2297; G11C 11/4072; G11C 11/4096; G11C 7/1063; G11C 11/2293; G11C 11/565; G11C 5/14; G11C 7/1045; G11C 11/4076; G11C 7/18; G11C 11/4087; G11C 7/222; G11C 11/40607; G11C 5/141; G11C 7/1066; G11C 7/1093; G11C 2207/2227; G11C 7/12; Y02D 10/00; Y02D 30/50; G11B 33/144; G11B 33/1406; G05D 23/1902

See application file for complete search history.

(56) References Cited

U.S. PATENT DOCUMENTS

| | | | | |
|---|---|---|---|---|
| 9,158,693 | B2 * | 10/2015 | Ananthakrishnan | ......................... G06F 1/3287 |
| 2002/0087904 | A1 * | 7/2002 | Cai | ......................... G06F 1/324 713/322 |
| 2003/0182509 | A1 * | 9/2003 | Glasco | ................ G06F 12/0813 711/119 |
| 2008/0147976 | A1 | 6/2008 | Bienek et al. | |
| 2008/0247252 | A1 * | 10/2008 | Ruf | .......................... G11C 5/14 365/226 |
| 2011/0026355 | A1 * | 2/2011 | Irisawa | .................... G11C 8/18 327/141 |
| 2011/0222696 | A1 | 9/2011 | Balachandran et al. | |
| 2012/0249219 | A1 * | 10/2012 | Shoemaker | .............. G01K 3/08 327/512 |
| 2013/0111121 | A1 * | 5/2013 | Ananthakrishnan | ........................ G06F 12/0864 711/128 |
| 2013/0138901 | A1 * | 5/2013 | Cordero | .............. G06F 11/1666 711/E12.103 |
| 2013/0282950 | A1 * | 10/2013 | Bert | ...................... G06F 1/3275 711/E12.001 |
| 2013/0318379 | A1 * | 11/2013 | Seshadri | ................ G06F 1/206 713/320 |
| 2014/0140156 | A1 * | 5/2014 | Shoemaker | ....... G11C 11/40615 365/201 |
| 2014/0143577 | A1 * | 5/2014 | Nachimuthu | ......... G06F 3/0647 713/324 |
| 2015/0346796 | A1 * | 12/2015 | Tan | .......................... G06F 1/324 713/322 |
| 2016/0078907 | A1 * | 3/2016 | Woo | ...................... G06F 3/0619 711/162 |
| 2017/0031376 | A1 * | 2/2017 | Coutts | ................... G06F 1/3206 |
| 2018/0165239 | A1 | 6/2018 | Daellenbach et al. | |
| 2019/0155766 | A1 * | 5/2019 | Kim | ..................... G06F 12/0866 |
| 2020/0012333 | A1 * | 1/2020 | Gendler | .................. G06F 1/324 |
| 2020/0142457 | A1 | 5/2020 | Stumpf et al. | |
| 2020/0159441 | A1 * | 5/2020 | Mayer | ...................... G11C 5/14 |
| 2020/0257604 | A1 * | 8/2020 | Roh | ..................... G06F 11/3058 |
| 2021/0191725 | A1 * | 6/2021 | Carlson | ................. G06F 9/3869 |
| 2022/0188208 | A1 * | 6/2022 | Gutierrez | ........... G06F 12/0864 |
| 2022/0206925 | A1 * | 6/2022 | Chauhan | ............. G06F 11/3055 |
| 2022/0382581 | A1 * | 12/2022 | Koskinen | .............. G06F 9/4831 |
| 2023/0094030 | A1 * | 3/2023 | Jha | ......................... G06F 9/5016 718/105 |
| 2023/0418756 | A1 * | 12/2023 | Confalonieri | ....... G06F 12/0804 |

FOREIGN PATENT DOCUMENTS

| | | | | | |
|---|---|---|---|---|---|
| TW | I285306 | B | * | 8/2007 | ............... G06F 1/20 |
| TW | 201037704 | A | * | 10/2010 | ......... G06F 12/0875 |
| WO | WO-2024205928 | A1 | * | 10/2024 | ........... G06F 9/5038 |

OTHER PUBLICATIONS

Plante, Jeannette et al. "Environmental Conditions for Space Flight Hardware—A Survey". NASA. <https://nepp.nasa.gov/docuploads/C5E0869C-0469-4D11-9FAA8012C8F52351/environmental%20Testing%20Survey.doc#:~:text=PPEs%20surveyed%20for%20the%20temperature,9)%20for%20several%20electrical%20subsystems.> (Year: 2004).*

International Search Report and Written Opinion, Application No. PCT/US2021/060905 dated Apr. 5, 2022.

PCT/US2021/060905 , "International Preliminary Report on Patentability", PCT Application No. PCT/US2021/060905, Jun. 22, 2023, 9 pages.

"Foreign Office Action", JP Application 2023534608, Aug. 26, 2025, 9 pages.

"Foreign Office Action", EP Application No. 21835462.9, Aug. 12, 2025, 12 pages.

* cited by examiner memory device 700 sensor 703 metadata (coherence state, etc.) 702A memory array (DRAM) 701 refresh 712 temperature information 301 refresh/span of control controller 711 metadata (access history, reuse distance, etc.) 702B memory controller 710 process
800

METHODS FOR CONFIGURING SPAN OF CONTROL UNDER VARYING TEMPERATURE

BACKGROUND

Wire resistance decreases with reduced operating temperature; accordingly, propagation delay for signals transmitted over wires at low temperature also decreases, while complementary metal-oxide semiconductor (CMOS) switching speeds increase. Thus, operating computing components in the cryogenic domain can be used to overcome CMOS scaling bottlenecks. For example, cryogenic cooling with liquid nitrogen (LN$_2$) can be used to overclock processing devices, for operation at higher frequencies. In general, cryogenic CMOS designs can operate at temperatures of LN$_2$ (77 K) down to liquid helium (4 K), and can be used to reduce the costs of operating datacenters and other computing systems.

BRIEF DESCRIPTION OF THE DRAWINGS

The present disclosure is illustrated by way of example, and not by way of limitation, in the figures of the accompanying drawings.

DETAILED DESCRIPTION

Figure 1:
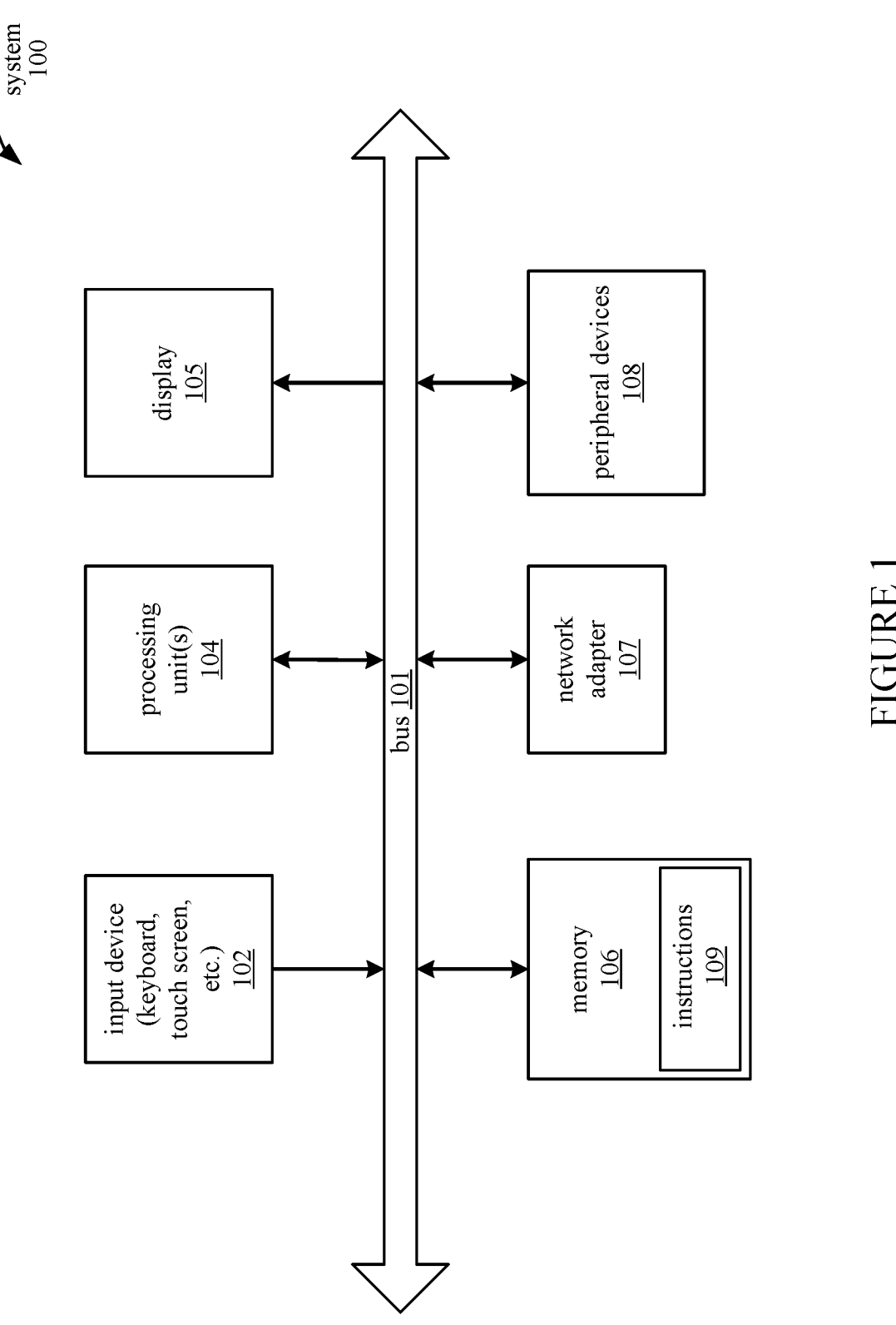
FIG. 1 illustrates a computing system, according to an embodiment.

The following description sets forth numerous specific details such as examples of specific systems, components, methods, and so forth, in order to provide a good understanding of the embodiments. It will be apparent to one skilled in the art, however, that at least some embodiments may be practiced without these specific details. In other instances, well-known components or methods are not described in detail or are presented in a simple block diagram format in order to avoid unnecessarily obscuring the embodiments. Thus, the specific details set forth are merely exemplary. Particular implementations may vary from these exemplary details and still be contemplated to be within the scope of the embodiments.

When performing physical design and layout, central processing unit (CPU) and graphics processing unit (GPU) designers rely on static and dynamic timing analysis to set wire lengths. These analyses are constrained by operating temperature, which is usually assumed to have a lower bound of around 0° C. However, the worst-case bounds for normal operating temperatures is much different than for operating temperatures in the cryogenic domain. Circuits designed to operate in cryogenic temperatures will not be optimized for normal operating temperatures (e.g., around room temperature).

In one embodiment of a computing system, the span of control of certain blocks or pipeline stages is configurable during runtime such that communication signal paths that are optimized for operation at cryogenic temperatures are enabled when operating at cryogenic temperatures, and are disabled at higher temperatures (e.g., room temperature). The increased CMOS switching frequencies and decreased wire resistance when operating at low temperatures allows for reduced pipeline lengths, larger caches, or hardware optimizations that are otherwise infeasible due to worst-case timing constraints at room temperature. Dynamically enabling and disabling these components and signal pathways based on the operating temperature allows the same device to increase its performance at low temperatures without violating timing constraints when operating at higher temperatures.

Low temperature operation can also be used when operating large computing installations, such as data centers performing computations on very large datasets. In such data centers, node density and power consumption directly impact the cost of owning and operating the data center, in terms of both real estate cost and energy cost; these are impacted by power consumption and space occupied by memory devices in the datacenter. Therefore, placing dense memory on-chip, or near to the compute chips, can help address these limitations.

Embedded DRAM (eDRAM) cells are logic compatible and are much denser than the static random-access memory (SRAM) cells commonly used for on-chip caches, but eDRAM cells also suffer from short data retention times. Thus, eDRAM cells are refreshed at a high rate at normal temperatures, leading to increased power consumption. However, as temperature is reduced, data retention times increase dramatically. When the operating temperature is at or near the cryogenic range (~77 K), data retention times can be greatly extended because leakage decreases sharply as temperature is reduced. In cold temperatures, power consumption is thus reduced while speeds increase.

One embodiment of a computing system reduces reducing refresh overheads in DRAMs based on application behavior, coherence state, and data retention times, which vary with temperature. This overcomes the problem of high refresh overheads in DRAMs that would otherwise prohibit their use as caches or on-chip devices. These techniques can be extended to large on-chip DRAMs or DRAM caches. In the case of cache coherent DRAM caches, the cache coherent states of individual blocks can be used to selectively refresh lines, which further reduces refresh overhead.

FIG. 1 illustrates an embodiment of a computing system 100 which enables the optimizations as described above when operating at low (e.g., cryogenic) temperatures. In general, the computing system 100 is embodied as any of a number of different types of devices, including but not limited to a laptop or desktop computer, mobile device, server, etc. The computing system 100 includes a number of components 102-108 that communicate with each other through a bus 101. In computing system 100, each of the components 102-108 is capable of communicating with any of the other components 102-108 either directly through the bus 101, or via one or more of the other components 102-108. The components 101-108 in computing system 100 are contained within a single physical enclosure, such as a laptop or desktop chassis, or a mobile phone casing. In alternative embodiments, some of the components of computing system 100 are embodied as peripheral devices such that the entire computing system 100 does not reside within a single physical enclosure.

The computing system 100 also includes user interface devices for receiving information from or providing information to a user. Specifically, the computing system 100 includes an input device 102, such as a keyboard, mouse, touch-screen, or other device for receiving information from the user. The computing system 100 displays information to the user via a display 105, such as a monitor, light-emitting diode (LED) display, liquid crystal display, or other output device.

Computing system 100 additionally includes a network adapter 107 for transmitting and receiving data over a wired or wireless network. Computing system 100 also includes one or more peripheral devices 108. The peripheral devices 108 may include mass storage devices, location detection devices, sensors, input devices, or other types of devices used by the computing system 100.

Computing system 100 includes one or more processing units 104, which in the case of multiple processing units 104 are capable of operating in parallel. The processing units 104 receive and execute instructions 109 that are stored in the memory subsystem 106. In one embodiment, each of the processing units 104 includes multiple computing nodes that reside on a common integrated circuit substrate. Memory subsystem 106 includes memory devices used by the computing system 100, such as random-access memory (RAM) modules, read-only memory (ROM) modules, hard disks, and other non-transitory computer-readable media.

Some embodiments of computing system 100 may include fewer or more components than the embodiment as illustrated in FIG. 1. For example, certain embodiments are implemented without any display 105 or input devices 102. Other embodiments have more than one of a particular component; for example, an embodiment of computing system 100 could have multiple buses 101, network adapters 107, memory devices 106, etc.

Figure 2:
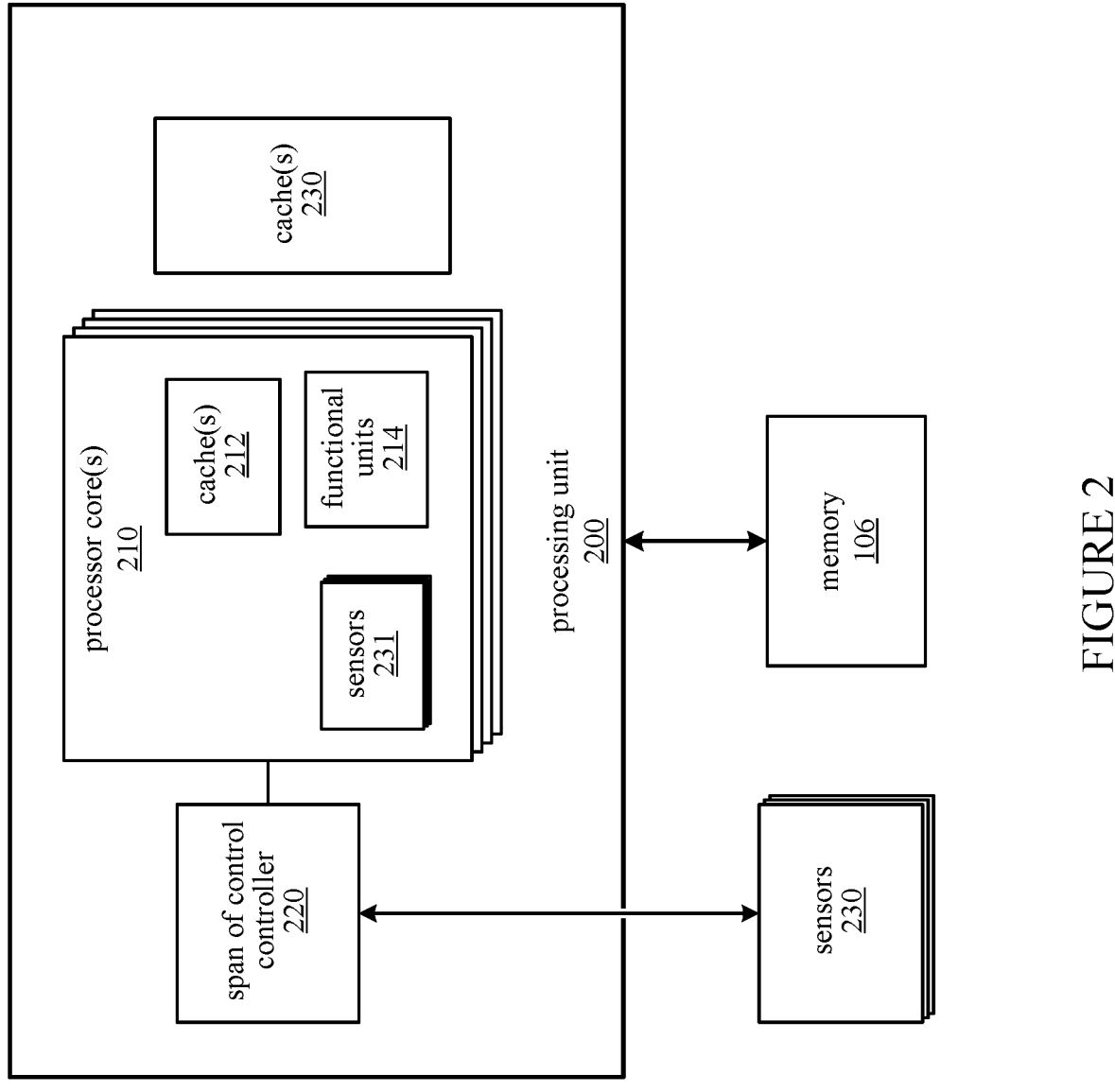
FIG. 2 illustrates components in a processing unit, according to an embodiment.

FIG. 2 illustrates hardware components in a processing unit 200, representing one of processing unit(s) 104, according to an embodiment. The processing unit 200 includes a set of one or more processor cores 210, a span of control controller 220, and shared cache(s) 230 (e.g., level 3 (L3) cache) residing on a single integrated circuit die. In alternative embodiments, some or all of the components 210-230 are located on separate die or in separate device packages. The components 210-230 are implemented using hardware circuitry or a using a combination of hardware, software, and/or firmware components. Workloads provided by instructions 109 are executed in the one or more processor core(s) 210 in the processing unit 200. Each of the processor core(s) 210 includes digital logic circuits that execute the instructions 109, such as functional units 214, one or more caches 212 (e.g., level 1 (L1) and level 2 (L2) caches) and their respective cache controllers. Sensors 231 reside in each of the processor cores 210 for measuring operating parameters, such as the operating temperature, of each processor core. The processing unit 200 may also include additional sensors (not illustrated) for measuring operating parameters from other locations in the processing unit 200, and sensors 230 for measuring parameters (e.g., temperature) from other locations in the computing system 100.

The span of control controller 220 is coupled with the processing unit 200, and resides on the same die as the components of processing unit 200, or, in alternative embodiments, on a separate die or integrated circuit package. The term "span of control" refers to the distance over which two components can communicate within a given time constraint, such as a clock cycle or number of clock cycles. Decreases in wire resistances and switching speeds due to, for example, operating at a lower temperature, increases the speed of signals transmitted over a fixed length communication path, which may include wires, switching and compute logic, etc. Alternatively, the span of control can be increased so that signals can be transmitted for longer distances within the same amount of time. Accordingly, the span of control controller 220 responds to changes in the operating parameters (e.g., temperature) measured by sensors 230-231 or other sensors by enabling and disabling longer signal pathways and/or other features used for performing computations in the processing unit 200. In general, longer signal pathways can be enabled between two processing circuit components, which are circuit blocks such as dispatch units, functional units, cache sets, additional memory blocks, or other devices used to perform computations in the processing unit 200. When the signal pathway is enabled, the components are able to communicate with each other over the enabled pathway when performing processing tasks. The components that are connected by the enabled signal pathway need not reside on the same integrated circuit die, or within the same device package. That is, the signal pathway can start in one integrated circuit die or device package, and end in another.

In general, the span of control controller 220 responds to changes in operating parameters measured by sensors 230 and/or 231. The span of control controller 220 compares each of the operating parameters with one or more threshold values, and enables or disables a set of communication paths or other features when a parameter increases above or decreases below one of its corresponding threshold values. In one embodiment, the sensors 230-231 include temperature sensors that indicate changes in the operating temperature to the span of control controller 220. For example, when the sensors 230 or 231 indicate a decrease in the operating temperature, the span of control controller 220 responds by enabling a set of signal pathways. Temperature thresholds observed by the controller 220 can represent changes between room temperature and different temperatures in the cryogenic domain, for example. The thresholds can also delineate smaller changes in operating temperature, as smaller changes in temperature can also affect signal propagation time. In one embodiment, the span of control configuration is determined dynamically at runtime. Alternatively, the span of control can be determined from user configuration settings, so that a user can manually configure the system for low-temperature operation. The controller 220 can then enable increased span of control features according to the user's configuration setting.

The signal pathways enabled when the temperature decreases (or the system is configured for low temperature operation) are longer than signal pathways in use prior to the temperature decrease (or when the system is configured for operation at normal temperatures). Due to the lower temperature, signals can propagate the length of the longer pathways without violating timing constraints determined by the circuit's clock frequency. A similar effect can also be achieved by lowering the clock frequency so that the timing constraints can still be met with the same signal propagation time. In one embodiment, the operating parameter to which the span of control controller 220 responds is a clock frequency of the circuit. That is, the controller 220 enables or disables signal pathways in response to changes in the clock frequency, which can be reported to the controller 220 or read from a register by the controller 220.

In one embodiment, the span of control controller 220 or another device calculates the temperature thresholds for enabling sets of signal pathways based on the present clock frequency of the circuit. Thus, either a decrease in the temperature or a decrease in the clock frequency can cause the controller 220 to enable the longer signal pathways. Accordingly, an increase in temperature or an increase in clock frequency can cause the controller 220 to disable the longer pathways.

One mechanism for increasing computational throughput is by enabling additional memory (e.g., additional cache or main memory regions) at low temperatures. The additional memory is accessed via longer signal pathways that would take too long to traverse at normal room temperatures; however, at lower (e.g., cryogenic) temperatures, signals are able to reach the additional memory within the timing constraints of the circuit design.

The span of control controller 220 responds to a decrease in temperature by enabling the additional memory and the signal pathways for accessing the additional memory. The additional memory can be in a main memory, cache device, or other memory device. Accordingly, the signal pathways enabled at low temperatures couple a controller device, such as a memory controller or cache controller, with the additional memory. The controller device is then able to respond to memory access requests by reading and writing data to the additional memory via the enabled signal pathways.

Figure 3:
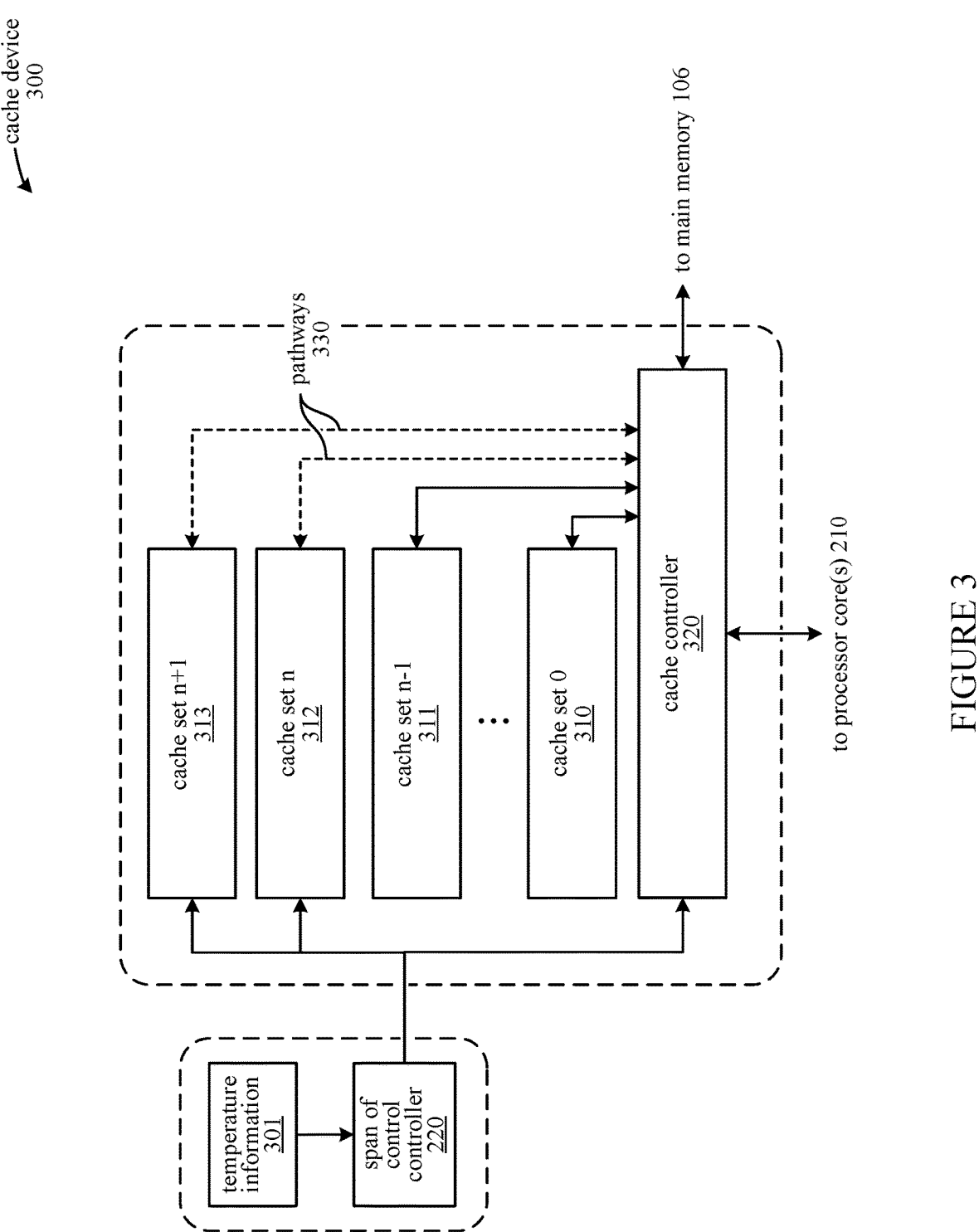
FIG. 3 illustrates a cache device, according to an embodiment.

FIG. 3 illustrates a cache device 300 that has signal pathways and cache sets that can be enabled or disabled by a span of control controller 220, according to an embodiment. Cache device 300 can represent one of the caches 212 in the processor core(s) 210, a shared cache 230, or other cache device in the computing system 100.

One of the factors limiting the size of caches is the length of the wires that deliver data to and from the most distant portions of the cache. When operated at room temperature it may not be possible to add more capacity while guaranteeing that the data can be delivered with the given timing constraints, since larger caches with many cache sets occupy area that is traversed with longer wires. Thus, caches are constrained in size due to the timing delay for transmitting signals over the longer wires when communicating with circuit blocks outside the cache.

However, for wires of a given length, the signal propagation delay decreases when operating at cold temperatures. Thus, a temperature-aware span of control controller 220 determines whether the cache size can be increased based on the temperature information 301, which includes current operating temperature, temperature thresholds (which may be adjusted dynamically based on clock frequency), past temperature history, and/or other temperature information. The cache size is increased at low temperatures by enabling additional cache regions when low temperature operation is detected.

As illustrated in FIG. 3, the cache device 300 includes n cache sets 310-311 that are enabled for all operating temperatures, and two additional sets 312-313 that are enabled when the controller 220 detects that the current operating temperature allows timing constraints to be met for signals transmitted over the signal pathways 330 that connect the additional sets 312-313 to the cache controller 320. Thus, under cryogenic or other low temperature operation, the increased span of control allows the capacity of the cache device 300 to be increased. When the temperature increases such that the timing constraints can no longer be met, the span of control controller 220 detects the temperature change and disables the signal pathways 330 and additional cache sets 312-313.

The cache sets 312-313 are enabled and disabled by clock or power gating. When the cache sets 312-313 are disabled, the signal pathways 330 are also disabled since the pathways 330 have no active destination, and signals are not transmitted over the pathways 330. In alternative embodiments, cache structures other than sets (e.g., banks) are enabled or disabled by the controller 220, depending on the organization of the cache 300.

When enabling or disabling the cache sets 312-313, the span of control controller 220 accordingly informs the cache controller 320 that the cache sets 312-313 are enabled or disabled. The cache controller 320 includes logic that responds by changing which portions of the cache device 300 are addressed in cryogenic operation and at normal temperatures. In addition, any dirty data in the sets 312-313 is written back to the backing memory 106 so that data is not lost when the sets 312-313 are disabled.

In low temperature operation, the added cache capacity can improve performance for many workloads that require large caches. In addition, where the cache device 300 is implemented using SRAM, power consumption due to leakage decreases at low temperatures; thus, the larger cache can be operated more efficiently at low temperatures than at normal room temperatures.

Figure 4:
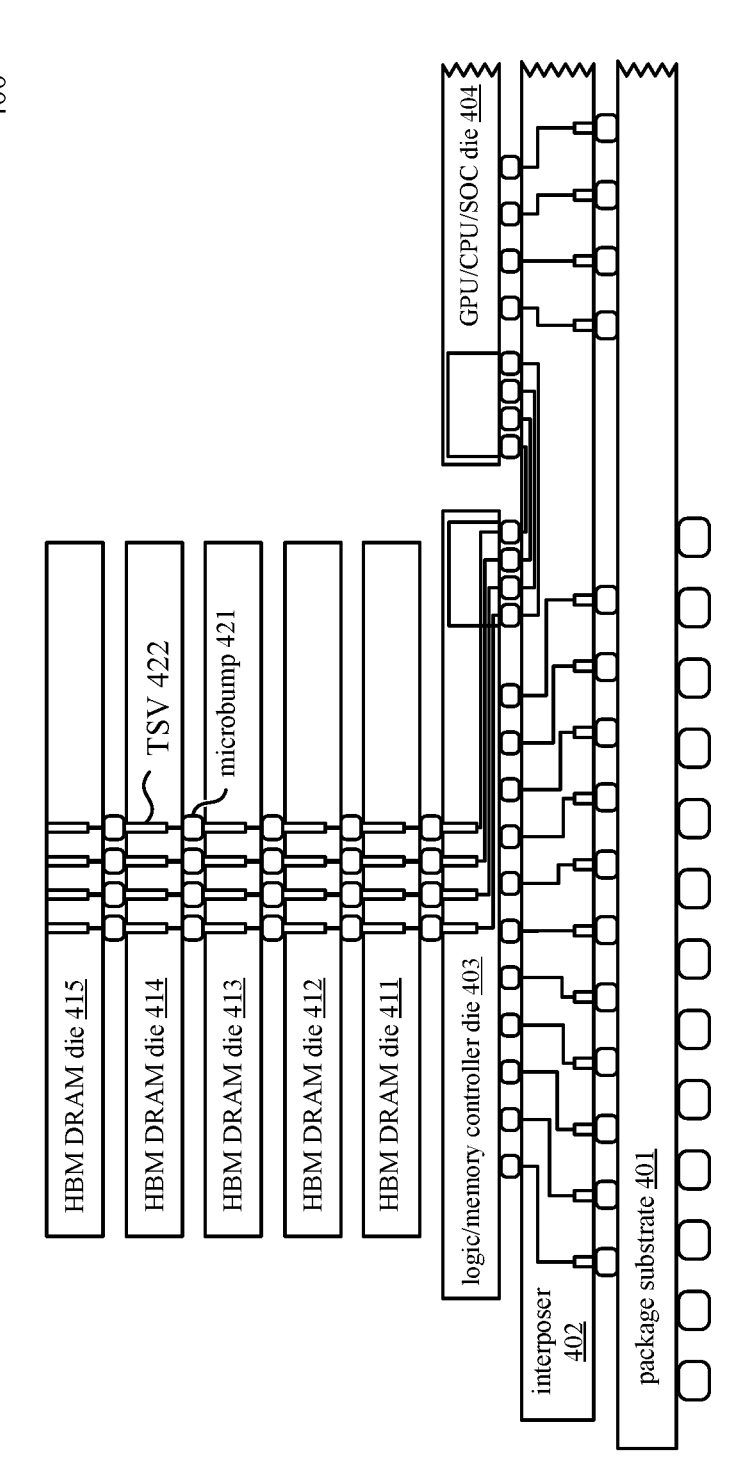
FIG. 4 illustrates a memory stack, according to an embodiment.

FIG. 4 illustrates a memory stack 400 that includes signal pathways and memory devices that can be enabled or disabled by a span of control controller 220, according to an embodiment. The memory stack 400 includes a stack of high bandwidth memory (HBM) DRAM dies 411-415 that are used to implement the main memory 106 in computing system 100. The DRAM dies 411-415 are stacked on each other, and are connected to lower devices in the stack by microbumps (e.g., 421) and through-silicon vias (TSVs, e.g., 422). A memory controller and other logic reside on a logic die 403 at the bottom of the memory stack 400. The logic die 403 is coupled with the package substrate 401 via an interposer 402, which routes the connections from the logic die 403 to the external pins of the package. The package also contains a GPU or CPU die 404 in which the span of control (SOC) controller 220 also resides. In alternative embodiments, the span of control controller 220 may reside on another die (e.g., logic die 403), or in another package.

One factor that constrains the number of die that can be stacked is the latency of transferring data between the higher positioned dies (e.g., 414, 415) in the stack and the logic die 403. Since the memory dies 411-415 are connected to the logic die 403 via signal pathways having different lengths, the memory stack 400 is designed to accommodate the worst-case latency to ensure a uniform view of all dies in the stack.

The memory stack 400 includes additional memory dies 414 and 415 that cannot meet timing constraints at room temperatures due to their distance from the logic die 403. The dies 414-415 are thus disabled when operating at normal room temperatures. When the operating temperature is sufficiently low, the dies 414-415 are able to meet timing constraints and are enabled by the span of control controller 220. The controller 220 also adjusts the timing parameters and clock frequencies of the enabled dies 414-415. Thus, low temperature operation allows the processing unit to utilize an increased amount of fast memory. At the same time, low temperature operation allows for heat to be transferred away from the chip faster. In addition, the refresh rates can be decreased, since data retention time in DRAM increases as temperature decreases.

Upon returning to normal room temperature operation, the additional memory dies 414 and 415 are disabled. Since the dies 414 and 415 store working data, the data stored in these dies is copied to one of the dies 411-413 that will still be enabled at room temperature operation, or to another memory, such as a swap file or other location in a hard disk drive. Data placement can also be handled by logic in the span of control controller 220 and/or the logic die 403 to minimize the performance impact of enabling and disabling memory dies. In one embodiment, the more frequently accessed data is stored in the closer memory dies (e.g., 411-413) that are always enabled so that enabling and disabling of the additional memory dies 414-415 has a smaller impact on system performance, since less data is copied upon disabling of the dies 414-415. During low temperature operation, the logic actively manages data placement by moving under-utilized data to the farther dies 414-415 and frequently accessed data to the closer dies 411-413.

The span of control controller 220 also includes some logic to determine which dies to enable or disable based on the operating temperature or other operating parameter. For example, the controller 220 may, depending on the memory demand, enable fewer than the total number of additional memory dies that can meet timing constraints at the present operating temperature. That is, when the already enabled dies 411-413 are not fully utilized, the controller 220 does not enable the additional memory dies 414-415 even at low temperatures. The span of control controller 220 can also enable dies that are farther away (i.e., connected by a longer signal pathway) before enabling dies that are closer to the logic die 403 for wear leveling, thermal, or other factors. In one embodiment, the controller 220 enables dies at different distances based on different thresholds; for example, die 414 may be enabled at a higher temperature threshold than die 415.

In one embodiment, the span of control controller 220 disables the additional memory dies 414-415 by clock gating or power gating, decreasing power consumption by the dies 414-415. Alternatively, the dies 414-415 are transitioned into a sleep or drowsy low power state, in which the memory cells retain their contents, but cannot be read or written.

The different methods of disabling the dies can have differing impacts to power consumption and re-enabling time. Often, modes that save more power take longer to transition. For example, the additional dies 414-415 can be re-enabled more quickly when placed in a low power state (e.g., sleep or drowsy mode); however, the dies 414-415 in the clock gated or power gated state consume less power than the low power states. Therefore, the method of disabling (e.g., clock gating, power gating, low power states, etc.) selected by the span of control controller 220 is based on factors such as the operating temperature, power consumption and performance goals, user configuration settings, etc.

In one embodiment, the span of control controller 220 collects performance related metrics related to these factors for determining when to enable or disable additional memory dies, cache sets, or other span of control features. For example, the controller 220 may identify cache sets that have been enabled for low temperature operation, but are underutilized. Accordingly, the controller 220 monitors addresses received at the cache controller to determine a level of utilization for the enabled cache sets. Cache sets identified as being underutilized are disabled to reduce power consumption.

In order to meet performance and power consumption goals, the span of control controller 220 additionally weighs the benefit of enabling or disabling different sets of span of control features with the performance impact of the transition. When determining whether to enable or disable a given set of span of control features, the controller 220 estimates how long the system can operate in the new state, then compares the benefit of operating in the new state for the estimate duration with the performance cost of the transition (e.g., the cost of moving data, reconfiguring controllers, etc.)

In a system that uses a probe filter based cache coherency mechanism, dynamically increasing the cache capacity based on the temperature also results in either increasing the size of the probe filter to track the additional cache lines, or increasing the granularity of each probe filter entry, so that each entry tracks an increased number of cache lines. Increasing the size of the probe filter messages increases the cost of transmitting and processing the messages, while using probe filters with coarse-grained entries can result in cache evictions due to false sharing upon a probe entry eviction. Snooping-based cache coherency protocols are another alternative that enable coherent execution by broadcasting a physical address being accessed over the cache bus. However, snooping protocols do not scale well when the number of processing cores increases.

Snooping can become practical at lower (e.g., cryogenic) temperatures due to lower cache access and on-chip link latencies. Therefore, a snooping based protocol implementation becomes practical for certain physical address ranges while a probe filter protocol is used for other physical address ranges when operating at low temperatures. Thus, the span of control controller 220 detects low temperature operation and dynamically switches between using snooping and a probe filter based coherency mechanism. At low temperatures, when the cache capacity is increased, a snooping based coherency mechanism is used. At normal temperatures, when the cache capacity is smaller, a probe filter mechanism is used.

In one embodiment, processing circuit components perform cache coherency checks by transmitting messages to cache devices over one or more signal pathways. A processing circuit component such as a processor core 210 performs its coherency checks according to the probe filter mechanism by using a directed probe messaging protocol to indicate its accesses to cache devices in the system 100 when operating at normal temperatures. After the change to low temperature operation, the span of control controller 220 enables additional cache sets (e.g., cache set 312-313) and switches the coherency mechanism for a certain physical address range or ranges to use a broadcast messaging protocol (i.e., snooping). Thus, the span of control controller 220 enables the transmission of broadcast coherency messages over the signal pathways between one or more processing circuit components and cache devices when operating at low temperatures. Embodiments of this hybrid cache coherency scheme support coherency without increasing the number of probe filter entries and without increasing the tracking granularity of each probe filter entry when the larger cache size is enabled. Thus, in some embodiments, the span of control controller 220 responds to changes in temperature or other operating parameters by enabling communication channels (e.g., broadcast coherency messaging) over signal pathways that are already enabled for other types of communications.

Figure 5A:
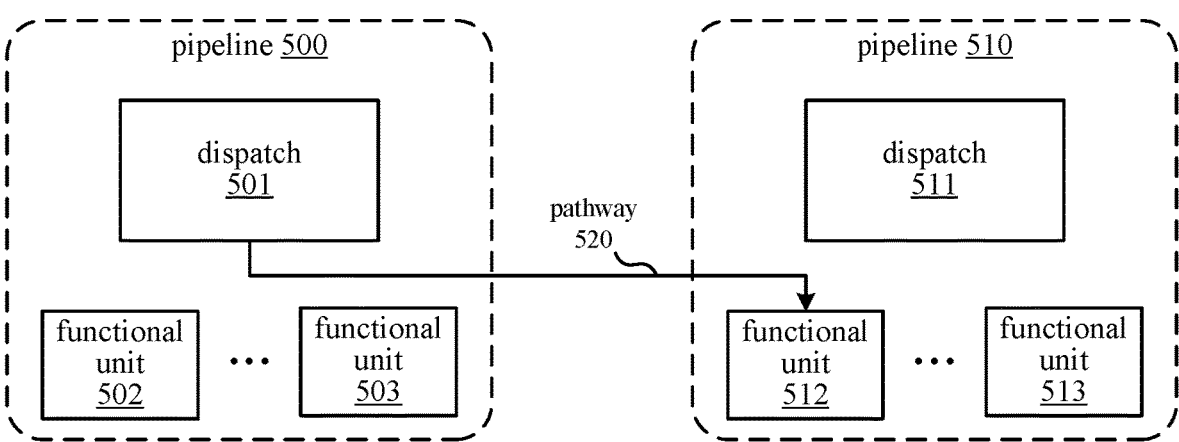
FIG. 5A illustrates dispatch and functional units in a processing core, according to an embodiment.
Figure 5B:
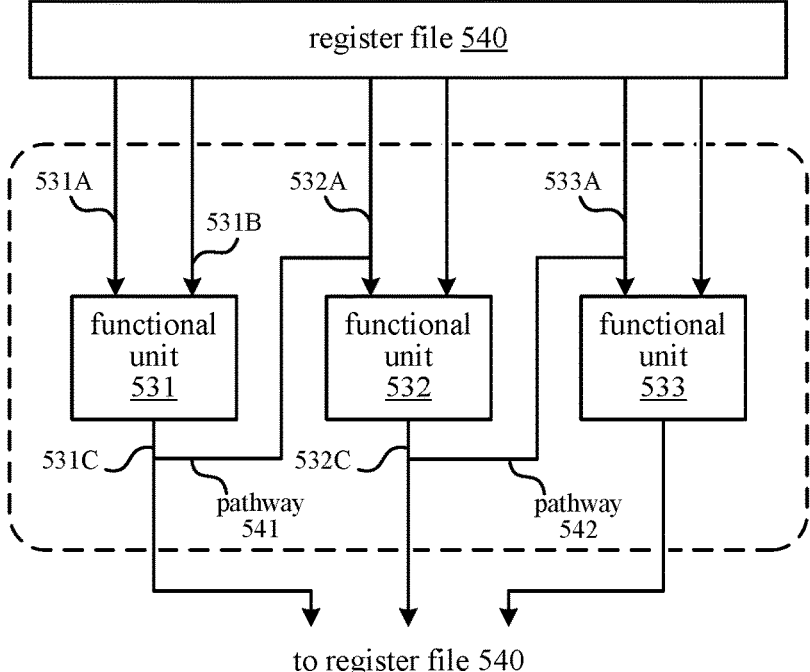
FIG. 5B illustrates functional units in a processing core, according to an embodiment.

FIGS. 5A and 5B illustrate the use of increased span of control under low temperature operation to modify functional unit dataflow, according to an embodiment. Each processor core 210 includes a number of functional units 214 that contain logic to perform computations for executing instructions 109. Since low temperature operation results in faster signal propagation, signal pathways can be longer without violating timing constraints. Therefore, signal pathways routed between functional units in GPUs, CPUs, accelerated processing units (APUs), accelerator devices, etc. can be longer and more complex.

FIG. 5A illustrates two pipelines 500 and 510 in a processing unit, such as a CPU, GPU, etc. Each of the pipelines 500 and 510 includes a respective dispatch unit 501 and 511. The dispatch units 501 and 511 receive instructions from an instruction fetch unit and dispatch the instructions to an appropriate functional unit. For example, instructions such as 'add', 'multiply', etc. are mapped to specific functional units that can perform the specified functions. Within each pipeline, the dispatch unit is able to dispatch instructions to a set of functional units; in pipeline 500, the dispatch unit 501 can dispatch instructions to functional units 502-503 and in pipeline 501, the dispatch unit 511 can dispatch instructions to functional units 512-513. Each set of functional units (e.g., 502-503 or 512-514) can include one or more units of the same type (e.g., one or more multiply units, add units, etc.).

During operation at normal temperatures, the dispatch unit (e.g., 501) selects functional units in its set (e.g., 502-503) that correspond to one or more instructions being dispatched in each cycle. The dispatch unit then communicates the instructions to the selected set of functional units, with each instruction being dispatched to a functional unit that can execute it (e.g., an 'add' instruction is dispatched to an adder functional unit). The size of the set of functional units to which the dispatch unit can send instructions is constrained by signal timing and the length of the signal pathways from the dispatch unit to the functional units. At lower temperatures, longer signal pathways can be used, so that a given dispatch unit can use more distant functional units In one embodiment, the span of control controller 220 enables longer signal pathways between dispatch units and functional units in other pipelines. For example, the span of control controller 220 responds to a decrease in temperature by enabling the signal pathway 520 to allow instructions from dispatch unit 501 to be dispatched to functional unit 512 in a different adjacent pipeline 510 that is farther away. In situations where the functional units 502-503 normally available to the dispatch unit 501 are overutilized, the dispatch unit 501 can dispatch an instruction to a free or underutilized functional unit 512 in another pipeline 510 when the pathway 520 is enabled. At normal temperatures, the dispatched instruction would not reach the functional unit 512 within the time constraints, but at low temperatures, the time constraints can be met. Thus, after the decrease in operating temperature, the dispatch unit 501 has a larger set of functional units to which it can dispatch instructions. The span of control controller 220 enables the signal pathways between the dispatch unit 501 and each of the additional functional units in the larger set in response to the decrease in temperature. While increased span of control is described herein as being achieved by a decrease in operating temperature, the same effect can be achieved by decreasing the clock frequency, which allows more time for the signals to propagate.

In some embodiments, the span of control controller 220 is also used to enable pathways between other types of components, such as pipeline schedulers, register files, etc. so that more complex dataflow arrangements can be constructed. This reduces the data movement from the register file and increases throughput.

In some embodiments, certain operations (which can correspond to single or multiple instructions) are executed by sequences of functional units. For example, an operation can be executed by performing a multiplication following an accumulate function, or a multiplication following an addition operation. Accordingly, a result generated by one functional unit (e.g., a multiplier) is used as an input to another functional unit (e.g., an adder). More complex operations can be performed by chaining together greater numbers of functional units in a similar manner. One factor that determines whether the length of a chain of functional units is feasible at a given operating temperature is whether signals can travel the length of the signal pathways connecting the functional units within the time constraints. Since lower operating temperatures result in decreased signal propagation delays and faster CMOS switching speeds, longer chains of functional units can be used to perform more complex operations within a single clock cycle at low temperatures.

FIG. 5B illustrates a set of functional units 531-533 used for performing operations on data in the processing unit 200, according to an embodiment. Each of the functional units 531-533 performs a function on operands received at their inputs and produces a result at its output. An output of one functional unit can be connected to an input of another functional unit to chain functional units together for executing more complex operations.

At normal operating temperatures, a sequence of operations taking longer than a single cycle is performed by, at the end of each cycle, storing intermediate results in a register file 540. In the next cycle, the intermediate result is read from the register file 540 and provided to an input of the next functional unit in the sequence. At low temperatures, longer chains of functional units can complete their operations within the same cycle time so that intermediate results are stored and retrieved from the register file 540 fewer times for each computation of a given length.

As illustrated in FIG. 5B, the functional unit 531 performs an operation on operands received at its inputs 531A and 531B, and produces a result at its output 531C. At normal temperatures, the result is produced within a single cycle, and the result is stored in the register file 540. In the next cycle, the result is retrieved from the register file 540 and provided to the input of functional unit 532, which performs the next operation in the sequence.

When low temperature (e.g., cryogenic) operation is detected, the span of control controller 220 enables signal pathways 541 and 542. The result produced at the output 531C of functional unit 531 is provided to the input 532A of the next functional unit 532 in the sequence of operations without accessing the register file 540. Similarly, the result produced at output 532C is provided to the input 533A of the next functional unit 533 in the sequence via enabled pathway 542. At normal operating temperatures, signals transmitted over the pathways 541 and 542 do not travel fast enough to meet timing requirements; however, due to the faster signal propagation time through these pathways at low temperature operation, a greater number of functional units can perform their operations within the timing constraints (e.g., within a single cycle) without register file access.

Figure 6:
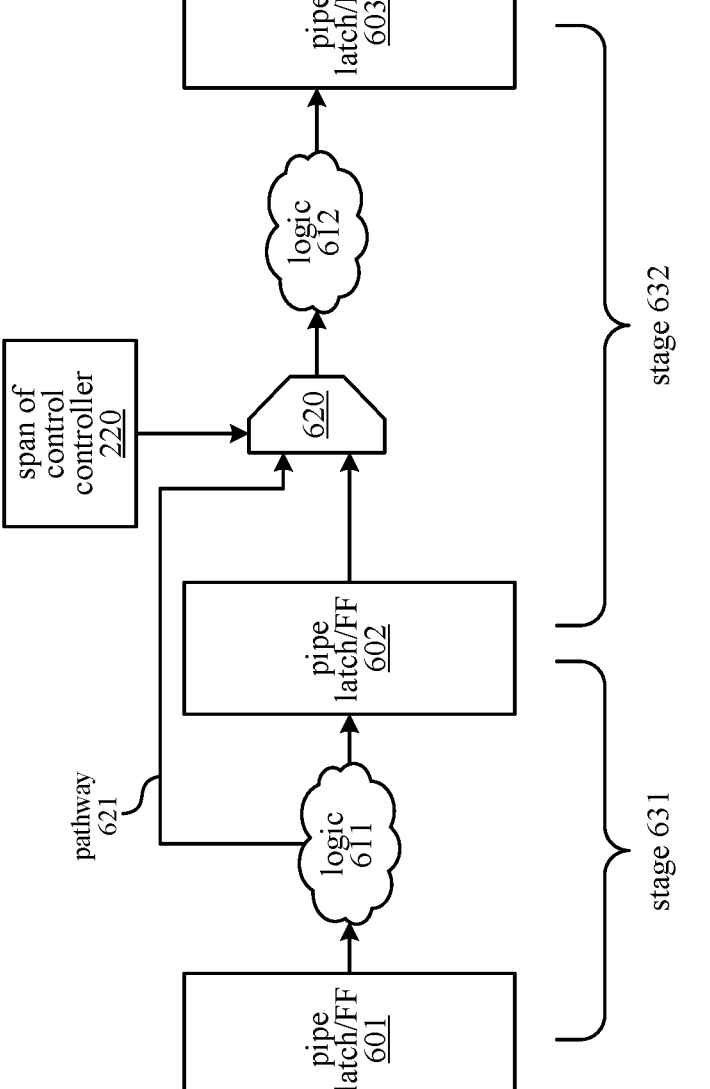
FIG. 6 illustrates a mechanism for combining pipeline stages, according to an embodiment.

In one embodiment, a span of control controller 220 responds to a change in an operating parameter (e.g., low temperature operation, lower clock frequency, etc.) by joining logic in successive pipeline stages, as illustrated in FIG. 6. In FIG. 6, pipeline stages 631 and 632 are successive stages in the same pipeline, each performing part of a larger computation using its respective logic block 611 or 612. The stages 631 and 632 are separated from other stages by pipeline latches 601-603, which store intermediate values calculated in each stage from one cycle to the next.

At normal operating temperatures, computations performed by the logic 611 are completed in a first clock cycle, and computations by logic 612 are completed in the next subsequent clock cycle. Logic 611 receives data on which it operates from latch 601 and, within a single cycle, generates an output which is stored in the next latch 602. In the next cycle, logic 612 receives the data from latch 602 and within one cycle, generates an output that is stored in latch 603. At normal operating temperatures, the signal propagation delay is high enough that the logic 611 and 612 in both stages 631 and 632 are not able to complete their computations within a single cycle (e.g., latch setup and/or hold times may be violated, or the output will not be generated by the time the latch is clocked).

However, at low (e.g., cryogenic) temperatures, the signal propagation delay is decreased so that both stages 631 and 632 would be able to meet the timing constraints and complete their computations within a single cycle. Accordingly, the span of control controller 220 detects when the operating temperature is sufficiently low and enables a pathway 621 to connect the stages 631 and 632 together by operating a switch 620. Thus, at low temperatures, the logic 611 generates an output, the enabled pathway 621 and switch 620 convey the output to the input of logic 612, and the logic 612 generates an output that is stored in the latch 603. The computations performed by both stages 631 and 632 are able to complete within a single clock cycle because the switching speeds and signal propagation delay are decreased due to low temperature operation, and because the enabled pathway 621 allows the intermediate value to bypass the latch 602. An output of the two stages 631 and 632 at low temperature is therefore produced in a single clock cycle, as compared to two clock cycles at normal operating temperatures.

In alternative embodiments, the span of control controller 220 can enable multiple pathways to bypass multiple respective latches and join multiple pipeline stages. The number of successive stages that are joined together by the controller 220 is dependent on the temperature that is detected. That is, at lower temperatures, longer pathways between pipeline latches are enabled (i.e., a greater number of pipeline stages are joined) than at higher temperatures.

Figure 7:
FIG. 7 illustrates a temperature aware refresh controller in a memory device, according to an embodiment.
Figure 7:
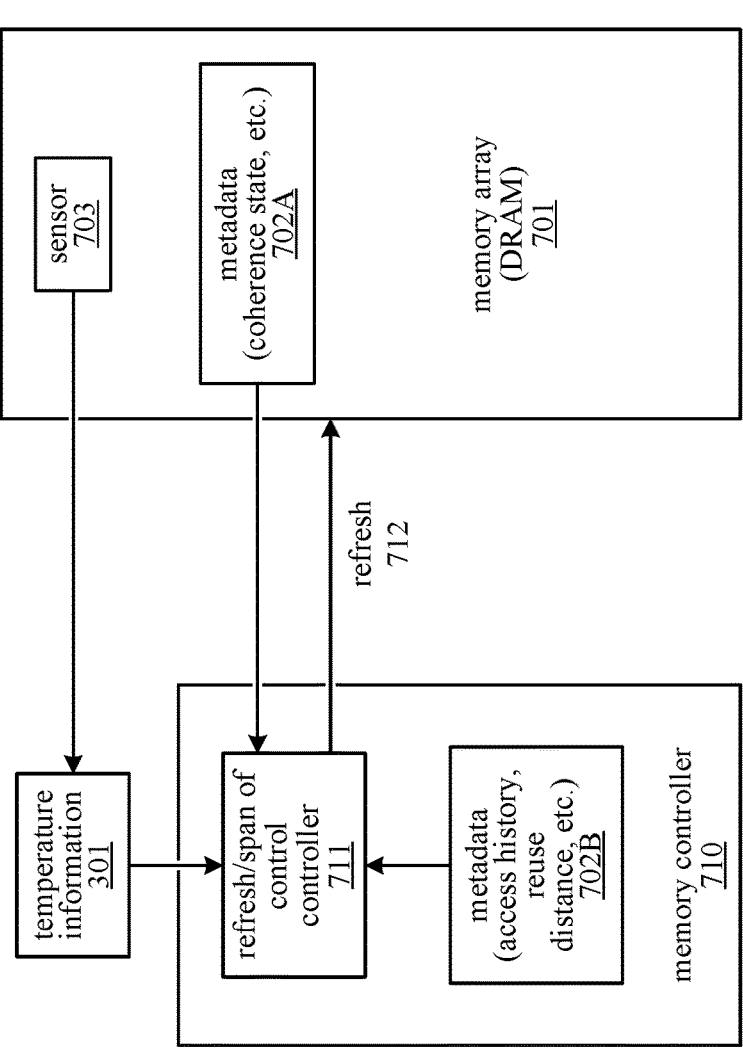

In one embodiment, temperature information 301 is also used to control a refresh signal 712 of memory in the computing system 100, as illustrated in FIG. 7. A memory device 700 is part of the memory 106 in the computing system 100, and includes a memory controller 710 for controlling a set of memory cells in a memory array 701. The memory cells are DRAM cells. Due to leakage of the capacitive elements that store data in the DRAM cells, the cells are refreshed periodically so that they retain their contents over time. At normal operating temperatures, the refresh period is selected so that the data stored in the cells is not lost in the worst case expected conditions. However, the amount of leakage is decreased substantially (and data retention time is increased) at low temperatures; therefore, a more relaxed refresh policy, in which the memory cells are refreshed less frequently, can be allowed when operating at low temperatures. The memory refresh time can also be adjusted based on memory state and/or usage history, which is used to determine whether specific portions of memory will be refreshed. For example, the refresh times can be adjusted based on memory line reuse, reuse distance information, sharing and/or coherence state, and other information about the data stored in the memory.

As illustrated in FIG. 7, the memory controller 710 includes a refresh controller 711, which, in one embodiment, can also perform span of control functions such as enabling and disabling pathways to memory regions based on the temperature, as previously described. A temperature sensor 703 measures the operating temperature of the memory array 701, which is included in the temperature information 301. The refresh controller 711 responds to a change in the operating temperature (or other operating parameter that can affect memory cell leakage) by changing the rate of a refresh signal 712 applied to the DRAM cells in the memory array 701. The refresh controller 711 compares the current operating temperature of the memory device 700 with one or more temperature thresholds, and calculates a worst case refresh period based on the threshold or thresholds that are exceeded, characteristics of the memory cells, and/or other parameters. A refresh rate is calculated that ensures that timing constraints will be met and data loss will not occur while the DRAM is operating at the detected operating temperature. Accordingly, when the memory device 700 switches from normal temperature to low temperature (e.g., cryogenic) operation, the memory refresh rate decreases and, when switching from low temperature operation to higher temperature operation, the memory refresh rate increases. In alternative embodiments, the operating temperature is obtained from one or more sensors in other locations in the processing unit 200 or computing system 100.

When operating at low temperatures, memory retention time is increased and therefore the refresh period can also be increased substantially. A longer refresh period results in reduced power consumption by the memory device 700. At normal operating temperatures, DRAM devices are not used as coherent cache devices due to the high amount of power consumed for refreshing the memory. However, at low temperatures, it is more feasible to operate the DRAM memory device 700 as a coherent cache due to the lower power consumption resulting from a longer refresh period.

The refresh controller 711 additionally determines which portions of the memory to refresh based on information about the data stored in those portions. When the memory device is used as part of the cache system, a coherence state (e.g., modified, owned, shared, invalid, etc.) is recorded for each portion (e.g., line) of data stored in the device. The refresh controller 711 reads metadata 702A describing these coherence states to determine which data to refresh. The memory controller 710 is thus aware of the cache coherence state of lines in the memory array 701 and optimizes its refresh strategy based on the coherence state of individual lines. If a line is clean with respect to main memory (for example, if the line is in the shared (S), exclusive (E), invalid (I), etc. states) then it may not need to be refreshed, and can be invalidated if the memory controller 710 determines that the line is not likely to be accessed soon. For coherency states where the data are dirty with respect to main memory, for example the owned (0), modified (M), etc. states, the memory controller can decide to refresh the data, or write back the line to main memory before invalidating and not refreshing the data. The memory controller determines whether it is beneficial to keep the line in the cache (e.g., the line may be kept if it is frequently accessed), and if so, then the memory controller refreshes line.

In one embodiment, metadata 702A includes a dirty mask for each memory line, which is used to determine how much valid data is in the line so the line can be either refreshed or written back and invalidated. If the dirty mask indicates that the number of dirty bytes in a line is below a threshold, the line is written back and invalidated without a refresh. Otherwise, if the number of dirty bytes is above the threshold, the line is refreshed. This policy reduces the number of refreshes performed without negatively impacting performance.

In one embodiment, the refresh controller 711 uses metadata 702B (e.g., recent access history, reuse distances, past memory reference stream information, etc.) and also additional temperature information 301 (e.g., past operating temperatures) when determining whether to refresh a portion of memory. For example, the refresh controller 711 may implement a policy in which any line that has not been accessed in the last N accesses will not be refreshed.

As another example, the refresh controller 711 can use coherence state and history information simultaneously, to avoid refreshing lines that have not recently been accessed (e.g., within the last N accesses, based on the history information) and invalidate only the lines that do not require a write back (according to the coherence state). A predictor can also be used, for example, to predict which lines are not likely to be accessed again, and therefore do not need to be refreshed.

For some types of workloads, the refresh controller 711 uses the metadata 702B to identify lines containing inactive or dead data that will not be used again. For example, in machine learning inference workloads, intermediate data generated by a prior producer layer, once consumed by the subsequent layer, is considered dead as the transient data will not be used by the application later. Refreshing of lines containing such transient intermediate data are therefore skipped even if the cache line is in a dirty coherence state.

In one embodiment, a policy is selected for implementing based on the detected operating temperature. For example, when the memory device 700 is operating at cryogenic temperatures, data retention times may be high while power consumption is low. Therefore, a policy is selected that allows the refresh controller 711 to expend more time and energy performing a more complex analysis to make more effective decisions. If the memory device 700 is operating at cold temperatures, but not necessarily in the cryogenic range, the refresh controller implements a simpler, yet still effective, adaptive refresh scheme.

Figure 8:
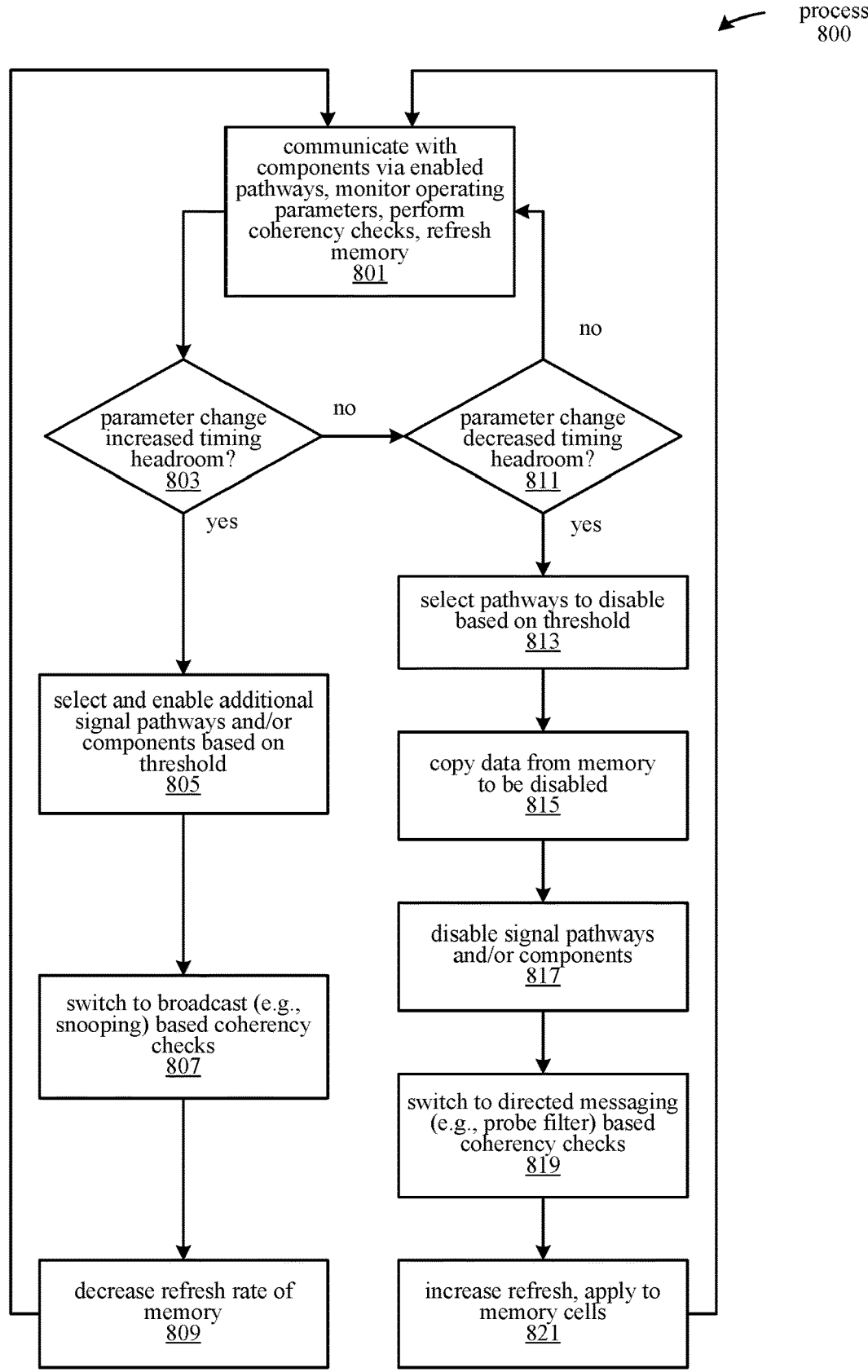
FIG. 8 illustrates a process for enabling and disabling span of control features, according to an embodiment.

FIG. 8 illustrates a process 800 for enabling expanded span of control in a computing system 100 in response to a change in an operating parameter (e.g., temperature, clock frequency), according to an embodiment. The process 800 is performed by components in the computing system 100, such as the span of control controller 220, refresh controller 711, and other components in the processing unit 200 or elsewhere in the computing system 100. The process 800 may be performed automatically to dynamically enable and disabled signal pathways and components at runtime; alternatively, some or all of the operations in process 800 may be triggered or confirmed by user input.

At block 801, the computing system 100 operates within an initial range for an operating temperature (e.g., room temperature) that is being monitored by sensors 230-231. While the monitored operating parameter is described herein as being an operating temperature, other parameters that affect the ability of signals to meet timing constraints can be monitored instead of or in addition to the operating temperature (e.g., temperatures of specific components, clock frequency, etc.). While operating in the initial temperature range, components in the system 100 communicate using a certain set of signal pathways that are enabled for operation within the initial range. For example, when operating within a normal temperature range, a subset of signal pathways is enabled that includes pathways for which timing constraints can be met, while excluding longer pathways for which timing cannot be met at normal temperatures. A pathway can be enabled by enabling a component or device (e.g., by applying a clock signal or power) at one or both ends of the pathway, by establishing a conductive path to the pathway via one or more switches, etc.

In one embodiment, at normal temperatures, the set of enabled signal pathways includes pathways connecting a cache controller 320 to a subset of cache sets 310-311 that are nearest to the cache controller 320, and/or pathways connecting a memory controller 403 to a subset of memory dies 411-414 that are nearest to the memory controller 320, while excluding pathways to farther cache sets (e.g., 312-313) and farther memory dies (e.g., 415), respectively. Accordingly, the enabled memory dies and cache sets are accessed over the enabled pathways when operating at low temperatures, while the farther memory dies (e.g., 415) and cache sets are disabled (e.g., 312-313).

In one embodiment, at normal temperatures, the set of enabled signal pathways includes signal pathways between a dispatch unit 501 and functional units 502-503 in the same pipeline, and excludes longer pathways (e.g., 520) between functional units in different pipelines. Accordingly, communications take place between sets of functional units in the same pipeline, and not between sets of functional units in different pipelines when operating at normal temperatures.

In one embodiment, at normal temperatures, the enabled pathways include shorter pathways (e.g., 541) connecting a set of two or more successive functional units (e.g., 531-532) in series. In some embodiments, an enabled pathway can include a series of multiple shorter pathways and functional units connected together, so long as the timing constraints can still be met. Longer pathways having a greater total length for which timing constraints cannot be met are disabled at normal temperatures.

At normal operating temperatures, pathways that join two or more pipeline stages (e.g., 631 and 632) are not enabled, since timing constraints cannot be met for performing computations in all of the associated logic blocks (e.g., 611 and 612) serially in the same cycle. For example, the pipeline stages 631 and 632 take at least two cycles to perform a computation using logic 611 and 612, by storing an intermediate result in latch 602 between cycles.

At normal operating temperatures, cache coherency checks are performed using a direct probe messaging protocol (i.e., probe filters) in which probe messages are addressed to specific computing nodes (e.g., processing or memory nodes) in the computing system 100, instead of a broadcast based protocol such as snooping. A memory refresh signal is periodically applied to DRAM in the computing system 100 at a rate that ensures data retention under the worst case conditions expected at normal operating temperatures. Various embodiments can implement any combination of the above span of control and/or temperature aware features.

During operation in any temperature range, the span of control controller 220 monitors for changes in the temperature (and/or other operating parameters that affect whether signal timing constraints can be met, such as clock frequency). A change in the parameter can be detected as an increase or decrease beyond a threshold; for example, a change can be detected when the operating temperature decreases below a certain limit. If no change has occurred (e.g., the temperature stayed within its current range), then the process 800 continues at block 811 since no change has increased the timing headroom. From block 811, the process 800 returns to block 801, since no change has decreased the timing headroom. Accordingly, the process 800 repeats blocks 801, 803, and 811 to continue operating the computing system 100 to process data using the current set of enabled pathways, components, and temperature aware features until a change in the monitored operating temperature and/or other parameters are detected.

At block 803, if a change in the monitored operating parameter or parameters increases timing headroom, making it easier to meet timing constraints, then the process 800 continues at block 805. For example, a decrease in the temperature or the clock frequency tends to increase timing headroom, and would cause the process 800 to continue at block 805. At block 805, additional signal pathways and/or processing circuit components are selected and enabled according to the parameter that changed and the threshold that was exceeded. The span of control controller 220 selects signal pathways to enable according to the lengths of the signal pathways. In one embodiment, signal pathways are associated with temperature thresholds and/or temperature ranges so that a set of signal pathways to enable is selected based on a lookup of the changed parameter (e.g., operating temperature) and the threshold it exceeded (e.g., a threshold between room temperature and low temperature).

In one embodiment, multiple subsets of pathways may be defined, each subset including pathways having lengths (as measured by physical length or signal propagation time) in a certain range, and each corresponding to a different temperature threshold or temperature range. The subsets can then be enabled in order as the temperature decreases progressively below their corresponding temperature thresholds. Accordingly, the pathways to be enabled at each progressively colder temperature threshold include the shortest pathways selected from the set of currently disabled signal pathways, since the length of the signal path for which timing can be met increases as the operating temperature decreases.

In embodiments that include cache sets 312 and 313 or additional memory 414-415 that can be enabled by the span of control controller 220, the cache sets or memory to be enabled are selected according to their distance from the cache controller 320 or memory controller 403. For example, if the memory dies 414 is disabled at normal operating temperatures, the controller 220 selects the die 414 for enabling based on their position as the next die beyond die 413 that is currently the most distant enabled die from the memory controller 403 in the memory stack 400. The components selected for enabling, such as additional cache sets 312 and 313 or the memory die 414 are enabled by applying a clock signal or power to these components. Enabling the selected signal pathways and components connects the components with one or more functional units in the processing unit 200 so that the enabled components can be used for processing data according to the instructions 109.

At block 807, the processing unit 200 switches from the directed messaging based coherency check protocol (e.g., probe filters) to a broadcast-based coherency check protocol (e.g., snooping). At block 809, a decrease in temperature also causes the refresh controller 711 to adjust the rate of refresh of DRAM cells in the system 100. The refresh signal is adjusted so that memory is refreshed less often, since capacitance leakage decreases at low temperatures. In various embodiments, the changes effected in blocks 805-809 are triggered independently by different temperature or operating parameter thresholds; alternatively, some or all of the enabled features, components, and pathways are triggered by the same thresholds. For example, the DRAM refresh rate may be triggered by a decrease in the DRAM operating temperature, rather than an operating temperature of the processor core(s) 210.

From block 809, the process 800 returns to block 801. At block 801, the processing unit 200 continues executing instructions 109 while operating in the new low temperature range, using the additional signal pathways and components enabled by the span of control controller 220. Dispatch units, functional units 214, cache and memory regions, and other processing circuit components in the processing cores 210 communicate with each other via the enabled longer pathways without violating timing constraints due to the lower temperature. Dispatch units such as dispatch unit 501 is able to communicate instructions to an expanded set of functional units that additionally includes functional units (e.g., 512) in other pipelines. Functional units such as units 531-533 are assembled into longer chains via enabled pathways 541 and 542 to reduce read and write accesses of register file 540. Pathways such as 621 that are enabled to bypass pipeline stage latches (e.g., 602) allow the logic 611 and 612 in respective pipeline stages 631 and 632 to be combined into a single stage. Compared to operation at normal temperatures, the computations by logic 611 and 612 can then be completed in fewer clock cycles, without violating timing constraints.

Coherency checks are also performed using a broadcast-based messaging protocol such as cache snooping during operation in the low temperature range, and DRAM is refreshed at a lower rate than at normal temperatures, reducing power consumption. The span of control controller 220 continues monitoring the temperature and other operating parameters during operation in the low temperature range.

At block 811, if the operating temperature increases, the timing headroom decreases. Therefore, since the span of control controller 220 detects a change that decreases the timing headroom, the process 800 continues at block 813. At block 813, the span of control controller 220 selects signal pathways and/or components to disable for which timing cannot be met with sufficient certainty when operating in the new temperature range. In one embodiment, the pathways and/or components to be disabled are selected based on the changed operating parameter or parameters and thresholds that were exceeded. The pathways and components to be disabled can include some or all of the pathways and components that were previously enabled at block 805, such as cache or memory regions, pathways between dispatch units and functional units in different pipelines, etc.

In the case where cache sets, memory dies, or other memory components are being disabled, data is copied from the memory components prior to the disabling when appropriate, as provided at block 815, to ensure that data is not lost when these components are disabled. The copying can also be performed based on the coherency state of the data. For example, in cache sets being disabled, dirty data is written back to main memory, while clean or invalid data is not. For memory regions, such as a memory die, to be disabled, the data stored in the region is migrated to another memory region that is will not be disabled due to the temperature change.

At block 817, the selected components and signal pathways are disabled. Components to be disabled are disabled by clock or power gating, and may be transitioned to a low power consumption state (e.g., sleep state). Signal pathways are disabled by, for example, disabling a component at either end of the pathway, by disconnecting the pathway using a switch, or otherwise ceasing communications over the pathway.

At block 819, the processing unit 200 switches from broadcast-based coherency check protocol (e.g., snooping) to the directed messaging based coherency check protocol (e.g., probe filters). At block 821, the increase in temperature also causes the refresh controller 711 to adjust the rate of refresh of DRAM cells in the system 100. The refresh signal is adjusted so that memory is refreshed more frequently, since capacitance leakage increases at higher temperatures. In various embodiments, the changes effected in blocks 813-819 are triggered independently by different temperature or operating parameter thresholds; alternatively, some or all of the enabled features, components, and pathways are triggered by the same thresholds. In one embodiment, the disabling of a pathway, component, or mode of operation can be triggered by the same threshold or a different threshold as the enabling of the same pathway, component, or mode of operation.

From block 821, the process 800 returns to block 801. At block 801, the computing system 100 operates with the enabled set of signal pathways, components, and modes of operation, as effected in the preceding blocks 813-821. The process 800 thus repeats while monitoring the operating temperature or other parameter for changes that increase or decrease signal timing headroom (at blocks 803 and 811, respectively), and enables or disables longer signal pathways, more distant components, and other modes of operation accordingly.

A method may include, in response to a change in an operating parameter of a processing unit, modifying a signal pathway to a processing circuit component of the processing unit, and communicating with the processing circuit component via the signal pathway.

In the method, the change in the operating parameter may be a decrease in an operational temperature of the processing unit, and modifying the signal pathway may include enabling the signal pathway.

The method may also include, in response to the change in the operating parameter, selecting the signal pathway for enabling from a plurality of disabled signal pathways. The selected signal pathway may have the shortest length of the plurality of disabled signal pathways, and the processing circuit component may be one of a plurality of processing circuit components each coupled to a functional unit of the processing unit by one of the plurality of signal pathways.

The method may also include, when the change in the operating parameter is an increase in the operating parameter, copying data from the processing circuit component, and modifying the signal pathway by disabling the signal pathway to the processing circuit component.

In the method, the processing circuit component may include a cache region coupled with a cache device in the processing unit.

The method may also include identifying a memory die for enabling based on a position of the memory die in a memory stack coupled with the processing unit, and in response to the change in the operating parameter, enabling the memory die by supplying power to the memory die. The processing circuit component may include a memory device residing on the memory die.

The method may also include, prior to the change in the operating parameter, communicating one or more instructions from a dispatch unit to a first set of one or more functional units. The processing circuit component may include a second set of one or more functional units, the signal pathway couples the dispatch unit with the second set of one or more functional units, and the signal pathway may be longer than a signal pathway between the dispatch unit and any of the first set of functional units. The method may also include communicating one or more instructions from the dispatch unit to the second set of functional units via the signal pathway.

The method may also include, prior to modifying the signal pathway, generating a first output using successive pipeline stages of the processing unit in a first number of cycles, and after modifying of the signal pathway, generating a second output using the successive pipeline stages in fewer than the first number of cycles. The signal pathway may bypass one or more pipeline latches between the successive pipeline stages by coupling logic in the successive pipeline stages.

The method may also include, prior to the change in the operating parameter, performing a first set of cache coherency checks using a directed probe messaging protocol, and after the change in the operating parameter, performing a second set of cache coherency checks using a broadcast messaging protocol over the signal pathway.

The method may also include, when the change in the operational temperature is a decrease in an operational temperature, changing a rate of a refresh signal applied to a dynamic random access memory (DRAM) device, and applying the refresh signal to the one or more portions of the DRAM device based on metadata describing data stored in the one or more portions. The change in the operating parameter may be a decrease in an operational temperature of the DRAM device.

A computing device may include a controller circuit to, in response to a change in an operating parameter of a processing unit, modify a signal pathway to a first processing circuit component of the processing unit, and a second processing circuit component to communicate with the first processing circuit component via the signal pathway.

In the computing device, the change in the operating parameter may be a decrease in an operational temperature of the processing unit, and the controller circuit may modify the signal pathway by enabling the signal pathway.

In the computing device, the processing circuit component may include additional memory coupled with the processing unit, and the second processing circuit component may include a controller device to store data in the additional memory via the signal pathway.

In the computing device, the second processing circuit component may include a dispatch unit to communicate one or more instructions to a first set of one or more functional units prior to the change in the operating parameter, the first processing circuit component may include a second set of one or more functional units, and the dispatch unit may further communicate one or more instructions to the second set of functional units via the enabled signal pathway after the change in the operating parameter.

The computing device may also include a plurality of successive pipeline stages to, prior to modifying the signal pathway, generate a first output in a first number of cycles, and after modifying of the signal pathway, generate a second output in fewer than the first number of cycles. The first processing circuit component may include logic in a first pipeline stage of the successive pipeline stages, the second processing circuit component may include logic in a second pipeline stage of the successive pipeline stages, and the signal pathway may bypass one or more pipeline latches between the successive pipeline stages.

In the computing device, the second processing circuit component, prior to the change in the operating parameter, may perform a first set of cache coherency checks using a directed probe messaging protocol, and after the change in the operating parameter, may perform a second set of cache coherency checks using a broadcast messaging protocol over the signal pathway.

The computing device may also include a memory controller to, in response to the change in the operating parameter, change a rate of a refresh signal applied to a dynamic random access memory (DRAM) device, and apply the refresh signal to the one or more portions of the DRAM device based on metadata describing data stored in the one or more portions. The change in the operating parameter may be a decrease in an operational temperature of the DRAM device.

A computing system may include a processing unit, and a controller circuit coupled with the processing unit to, in response to a change in an operating parameter of a processing unit, modify a signal pathway from a first processing circuit component of the processing unit to a second processing circuit component. The first processing circuit component may communicate with the second processing circuit component via the signal pathway.

In the computing system, the change in the operating parameter may be a decrease in an operational temperature of the processing unit, and the computing system may also include a set of one or more temperature sensors to indicate the change to the controller circuit. The second processing circuit component may reside on a different integrated circuit die than the first processing circuit component.

The computing system may also include a memory device coupled with the processing unit. The first processing circuit component may include a portion of the memory device.

As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a non-transitory computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The non-transitory computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Generally, a data structure representing the computing system 100 and/or portions thereof carried on the computer-readable storage medium may be a database or other data structure which can be read by a program and used, directly or indirectly, to fabricate the hardware including the computing system 100. For example, the data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates from a synthesis library. The netlist includes a set of gates which also represent the functionality of the hardware including the computing system 100. The netlist may then be placed and routed to produce a data set describing geometric shapes to be applied to masks. The masks may then be used in various semiconductor fabrication steps to produce a semiconductor circuit or circuits corresponding to the computing system 100. Alternatively, the database on the computer-readable storage medium may be the netlist (with or without the synthesis library) or the data set, as desired, or Graphic Data System (GDS) II data.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be in an intermittent and/or alternating manner.

In the foregoing specification, the embodiments have been described with reference to specific exemplary embodiments thereof. It will, however, be evident that various modifications and changes may be made thereto without departing from the broader scope of the embodiments as set forth in the appended claims. The specification and drawings are, accordingly, to be regarded in an illustrative sense rather than a restrictive sense.

What is claimed is:

1. A method, comprising:
   detecting a decrease in an operational temperature of a processing unit below a threshold value;
   in response to the decrease in the operational temperature of the processing unit below the threshold value, enabling a processing circuit component and enabling a disabled signal pathway for accessing the enabled processing circuit component, wherein the enabled signal pathway is selected based on having a shortest length of a plurality of disabled signal pathways; and
   accessing the enabled processing circuit component via the enabled signal pathway.

2. The method of claim 1, further comprising:
   in response to an increase in the operational temperature of the processing unit, copying data from the enabled processing circuit component.

3. The method of claim 1, wherein the enabled processing circuit component comprises a cache that includes a cache region coupled with a cache device in the processing unit.

4. The method of claim 1, further comprising:

identifying a memory die for enabling based on a position of the memory die in a memory stack coupled with the processing unit; and enabling the memory die by supplying power to the memory die, wherein the enabled processing circuit component resides on the memory die.

5. The method of claim 1, wherein the processing circuit component comprises a cache, and wherein the method further comprises:

prior to the decrease in the operational temperature of the processing unit, performing a first set of cache coherency checks using a directed probe messaging protocol; and after the decrease in the operational temperature of the processing unit, performing a second set of cache coherency checks using a broadcast messaging protocol over the enabled signal pathway.

6. The method of claim 1, wherein the threshold value corresponds to a cryogenic temperature.

7. The method of claim 1, wherein the processing circuit component comprises a cache.

8. The method of claim 1, further comprising:

changing a rate of a refresh signal applied to a dynamic random access memory (DRAM) device; and applying the refresh signal to one or more portions of the DRAM device based on metadata describing data stored in the one or more portions.

9. A computing device, comprising:

a controller circuit configured to, in response to a decrease in an operational temperature of a processing unit below a threshold value, enable a first processing circuit component and a signal pathway for accessing the enabled first processing circuit component, wherein the enabled signal pathway is selected based on having a shortest length of a plurality of disabled signal pathways;

a second processing circuit component configured to communicate with the enabled first processing circuit component via the enabled signal pathway; and the controller circuit further configured to disable the enabled first processing circuit component and the enabled signal pathway when the operational temperature of the processing unit increases above the threshold value.

10. The computing device of claim 9, wherein:

the second processing circuit component comprises a controller device configured to store data in the enabled first processing circuit component via the enabled signal pathway.

11. The computing device of claim 9, wherein: the second processing circuit component is configured to, prior to the decrease in the operational temperature of the processing unit, performing a first set of cache coherency checks using a directed probe messaging protocol; and after the decrease in the operational temperature of the processing unit, performing a second set of cache coherency checks using a broadcast messaging protocol over the enabled signal pathway.

12. The method of claim 1, further comprising disabling the enabled processing circuit component and the enabled signal pathway when the operational temperature of the processing unit increases above the threshold value.

13. The method of claim 1, wherein the accessing comprises writing data to the enabled processing circuit component via the enabled signal pathway.

14. The method of claim 1, wherein the accessing comprises reading data from the enabled processing circuit component via the enabled signal pathway.

15. A computing system, comprising:

a processing circuit component having at least a first region and a second region, wherein a first signal pathway for accessing the first region of the processing circuit component is enabled and wherein a second signal pathway for accessing the second region of the processing circuit component is disabled, wherein the second signal pathway is longer than the first signal pathway; and a processing unit configured to enable the second region of the processing circuit component and the second signal pathway for accessing the second region of the processing circuit component when a current operating temperature of the processing unit is below a threshold value.

16. The computing system of claim 15, wherein the second signal pathway is enabled when the processing unit determines that the operational temperature of the processing unit allows timing constraints to be met for signals transmitted over the second signal pathway.

17. The computing system of claim 15, wherein the threshold value corresponds to a cryogenic temperature threshold.

18. The computing system of claim 17, wherein the second signal pathway is disabled when the current operating temperature of the processing unit rises above the cryogenic temperature threshold.

19. The computing system of claim 15, wherein the processing unit is further configured to enable a third region of the processing circuit component and a third signal pathway for accessing the third region of the processing circuit component when the current operating temperature of the processing unit is below the threshold value.

20. The computing system of claim 15, wherein the processing unit enables reading data from the enabled second region of the processing circuit component via the enabled second signal pathway.

\* \* \* \* \*